United States Patent [19]

Bosselmann

[11] Patent Number: 5,764,046

[45] Date of Patent: Jun. 9, 1998

[54] OPTICAL METHOD AND DEVICE FOR MEASURING AN ALTERNATING ELECTRICAL CURRENT WITH TEMPERATURE COMPENSATION

[75] Inventor: Thomas Bosselmann, Erlangen, Germany

[73] Assignee: Siemens Atkiengesellschaft, Munich, Germany

[21] Appl. No.: 532,781

[22] PCT Filed: Mar. 10, 1994

[86] PCT No.: PCT/DE94/00252

§ 371 Date: Sep. 29, 1995

§ 102(e) Date: Sep. 29, 1995

[87] PCT Pub. No.: WO94/24573

PCT Pub. Date: Oct. 27, 1994

[30] Foreign Application Priority Data

Apr. 14, 1993 [DE] Germany ............... 43 12 183.7

[51] Int. Cl.⁶ .................................................. G01R 31/00
[52] U.S. Cl. .................................................. 324/96
[58] Field of Search ...................... 324/96, 244.1, 324/105; 340/870.17; 359/249

[56] References Cited

U.S. PATENT DOCUMENTS

| | | | |
|---|---|---|---|
| 4,563,639 | 1/1986 | Langeac | 324/96 |
| 4,755,665 | 7/1988 | Ulmer, Jr. et al. | 250/214 |
| 4,973,899 | 11/1990 | Jones et al. | 324/96 |
| 5,053,617 | 10/1991 | Kakizaki et al. | 250/227.21 |
| 5,382,901 | 1/1995 | Okajima et al. | 324/224.1 |
| 5,416,860 | 5/1995 | Lee et al. | 385/12 |
| 5,486,754 | 1/1996 | Cruden et al. | 324/96 |
| 5,500,909 | 3/1996 | Meier | 385/12 |

FOREIGN PATENT DOCUMENTS

| | | |
|---|---|---|
| 0 088 419 | 9/1983 | European Pat. Off. . |
| 0 557 090 | 8/1993 | European Pat. Off. . |
| WO91/01501 | 2/1991 | WIPO . |

OTHER PUBLICATIONS

Proceedings of the Conference on Optical Fiber Sensors OFS/1988, New Orleans (US), pp. 288–291 (Month Unavailable).

*Primary Examiner*—Vinh P. Nguyen
*Assistant Examiner*—Russell M. Kobert
*Attorney, Agent, or Firm*—Kenyon & Kenyon

[57] ABSTRACT

In a magneto-optic method of measuring an A.C. current in a conductor, the plane of rotation of linearly polarized light is rotated through a measuring angle in a Faraday element surrounding the conductor, the angle being a measure of the current strength. This light is divided into two linearly polarized light signals, with polarization planes directed at right angles to each other, which are converted by opto-electro converters into corresponding electrical signals. The two signals are used to form a functional value that represents the temperature. This value is used, together with the first signal, to determine a temperature-compensated measuring signal for the A.C. current.

20 Claims, 1 Drawing Sheet

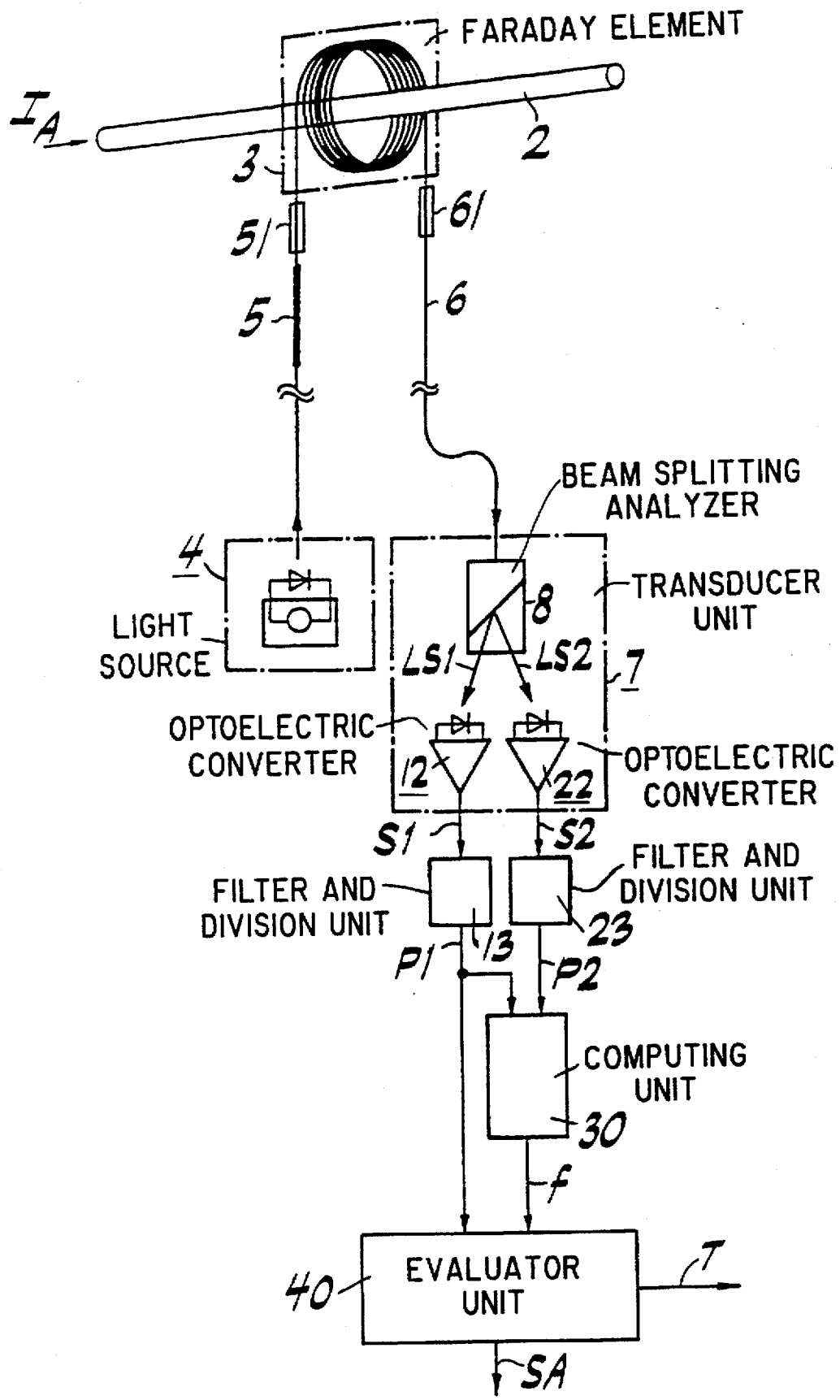

OPTICAL METHOD AND DEVICE FOR MEASURING AN ALTERNATING ELECTRICAL CURRENT WITH TEMPERATURE COMPENSATION

BACKGROUND OF THE INVENTION

The present invention relates to a method and device for measuring an alternating electrical current in a current conductor in general, and more particularly to such a measurement method and device in which temperature compensation is provided in a simple manner.

A method for measuring an alternating electrical current in a current conductor using a Faraday element associated with the current conductor into which linearly polarized light is coupled, the plane of polarization of this linearly polarized light then being rotated through a measuring angle on the basis of the Faraday effect, the measuring angle being a measure of the alternating electrical current in the current conductor; the light with the polarization plane rotated through the measuring angle coupled out of the Faraday element and divided into two light signals having different planes of polarization; and each of the two light signals converted into an electrical signal which is a measure of the intensity of the corresponding light signal, and a device for carrying out this method is described, for example, in U.S. Pat. No. 4,755,665.

Thus, optical measuring devices for measuring an electrical current in a current conductor using the Faraday effect, which are also referred to as magneto-optic current transducers are known. The Faraday effect is understood to be the rotation of the plane of polarization of linearly polarized light in dependence upon a magnetic field. The angle of rotation is proportional to the path integral over the magnetic field along the path covered by the light, using the Verdet constant as a proportionality constant. The Verdet constant is dependent upon the material through which the light is passing, on its temperature, and on the wavelength of the light. To measure the current, a Faraday element, which is made of an optically transparent material that demonstrates the Faraday effect, generally glass, is arranged in the proximity of the current conductor.

Linearly polarized light is sent by a transmitter unit through the Faraday element. The magnetic field produced by the electrical current effects a rotation of the plane of polarization of the light in the Faraday element through a polarization angle of rotation, which can be evaluated by an evaluator unit as a measure of the strength of the magnetic field and, thus, of the intensity of the electric current. The Faraday element generally surrounds the current conductor, so that the polarized light circulates around the current conductor in a quasi closed path. As a result, the size of the polarization angle of rotation is roughly directly proportional to the amplitude of the measuring current.

In one prior device, the Faraday element is designed as a solid glass ring around the current conductor. In this specific embodiment (EP-B1-0 088 419), the light circulates around the current conductor once.

In another known device, the Faraday element is designed as part of an optical monomode fiber, which surrounds the current conductor in the form of a measuring winding. Thus, for one pass-through, the light circulates around the current conductor N times, where $N \geq 1$ is the number of turns of the measuring winding. Two types of such magneto-optic current transducers having an optical-fiber measuring winding are known, namely the transmission type and the reflection type. In the case of the transmission type, the light is coupled into one end of the fiber and coupled out again at the other end, so that the light only passes through the measuring winding once. On the other hand, in the case of the reflection type, the other end of the fiber has a reflecting surface, so that the light coupled into the first end is reflected at this other reflecting end; it passes through the measuring winding a second time in the reverse direction, and is emitted at the first end again. Due to the non-reciprocity of the Faraday effect, given a reverse pass-through, the plane of polarization of the light is rotated again by the same amount in the same direction. Thus, given the same measuring winding, the angle of rotation is twice as large as in the case of the transmission type. A beam splitter is provided to separate the light that is coupled in from the light that is coupled out (WO 91/01501).

In addition, methods are known for evaluating the information contained in the rotated plane of polarization of the measuring light over the measuring current, and corresponding devices for implementing these methods are known, in the case of which, in principle, all specific embodiments of Faraday elements can be provided.

A problem encountered in the case of all magneto-optic current transducers are the interference effects caused by linear birefringence in the Faraday element and the optical transmission paths. Linear birefringence of this type can be the result of mechanical stresses in the material caused, for example, by bending or vibration and, in particular, by temperature variations.

In the case of the afore-mentioned magneto-optic current transducer described in EP-B1-0 088 419, the light from a light source is linearly polarized by a polarizer and then coupled into the Faraday element. The linearly polarized light passes through the Faraday element and is coupled out again. The emitted light is split by a Wollaston prism, acting as a beam-splitting analyzer, into two linearly polarized light signals A and B with planes of polarization directed at right angles to one another. These two light signals A and B are transmitted via corresponding optical transmission fibers to corresponding light detectors and converted into corresponding electrical signals PA and PB. From these two signals PA and PB, a Faraday angle of rotation is calculated as a measuring signal in a computing unit, this measuring signal corresponding to the quotient (PA−PB/PA+PB), the difference and the sum of the two signals. By forming this quotient, one compensates for different sensitivities of the light detectors and different damping factors for the intensities of the light signals A and B in the two transmission fibers. However, it does not allow one to compensate for temperature effects.

In the case of another known evaluation method, the two signals PA and PB are each subdivided in a filter into their direct-current components PA(DC) or PB(DC) and their alternating-current components PA(AC) or PB(AC). For each of the signals PA and PB, the quotient QA=PA(AC)/PA(DC) or QB=PB(AC)/PB(DC) is formed from their alternating-current component PA(AC) or PB(AC) and from their direct-current component PA(DC) or PB(DC) to compensate for varying light intensities caused by fluctuations in transmission and sensitivity. From each of these two quotients QA and QB, an average time value $\overline{QA}$ and $\overline{B}$ is generated and, finally, from these two average values $\overline{QA}$ and $\overline{QB}$, a quotient $Q=\overline{QA}/\overline{QB}$ is formed. Within the framework of an iteration method, a comparison is made with standardized values stored in a table of values (look-up table) to obtain a correction factor K for the calculated quotient Q. The quotient Q×K corrected by this correction factor K is retrieved as a temperature-compensated measuring value for the measuring current. This method makes it possible to reduce the temperature sensitivity of the magneto-optic current transducer by about 50 times. (Proc. Conf. Opt. Fiber Sensors OFS 1988, New Orleans, pp. 288–291 and U.S. Pat. No. 4,755,665).

However, this iteration method is quite expensive.

Thus, there is a need to provide a method and device for measuring an alternating electrical current in a current conductor using the Faraday effect, in which the effects of temperature on the measuring signal will be reduced.

SUMMARY OF THE INVENTION

The present invention fills this need providing such a method and device. Starting with the method and device of the general type described above, i.e., as in U.S. Pat. No. 4,755,665, the present invention does this by forming a functional value which is an unequivocal measure of the temperature from the two electrical signals and with this functional value and the first electrical signal determining a substantially temperature-independent measuring signal representative of the alternating current.

The present invention starts out from the observation made from measurements, that the two measuring channels have temperature coefficients with different operational signs for the two light signals in their direct-signal components, and have temperature coefficients with the same, generally positive operational signs in their alternating-signal components. This means that the direct-signal component of one signal increases with rising temperature and the direct-signal component of the other signal decreases. On the other hand, the alternating-signal component for both signals increases with a rising temperature. The present invention is based on the consideration that by generating a functional value from the two signals, which in some instances are also normalized signals, while utilizing the observed different temperature dependencies of the direct-signal components and alternating-signal components, a measure can be obtained for the temperature T, and the temperature-dependent operating point drift of the Faraday sensor can be corrected with this functional value.

BRIEF DESCRIPTION OF THE DRAWINGS

The single FIGURE is a schematic diagram of a device for measuring an electrical alternating current using the Faraday effect in accordance with the present invention.

DETAILED DESCRIPTION

As illustrated in the FIGURE, current conductor 2 is surrounded by a Faraday element 3. A light source 4 supplies light to the Faraday element through a polarizer 5. An optical waveguide 6 couples the light emitted from the Faraday element 3 to a transducer unit 7, the electrical outputs of which are coupled through respective filter and division units 13 and 23 to a computing unit 30, the output of which, along with the output of unit 13 is coupled into an evaluator unit 40.

Thus, at one input of the Faraday element 3, light from the light source 4 that is linearly polarized in the polarizer 5 is coupled into the Faraday element 3. Instead of the light source 4 and polarizer 5, a polarized light source, for example, a laser diode, can also be provided. At one output of the Faraday element 3, the light is coupled out again and directed via the polarization-sustaining optical waveguide 6, for which a monomode optical fiber is preferably provided, to the transducer unit 7. Due to its polarization-sustaining property, damping losses in the optical waveguide 6 play virtually no role. The emitted light exhibits a polarization that is rotated by a measuring angle α because of the Faraday effect. In this case, the measuring angle α is dependent upon the alternating current $I_A$ in the current conductor 2. In the illustrated embodiment, the Faraday element 3 itself and the transmission fiber between the light source 4 and the Faraday element 3 are designed as parts of the optical waveguide 6. The optical waveguide 6 thereby surrounds the current conductor 2, preferably concentrically, in a measuring winding having at least one measuring turn. Besides the depicted specific embodiment of the transmission type, a current transducer of the reflection type is also possible. Moreover, a solid member of a transparent material, preferably a glass ring, can also be provided as a Faraday element 3. Two splices 51 and 61 can be utilized with the Faraday element 3 as detachable connections to the light source 4 or to the transducer unit 7. The transducer unit 7 can also be arranged directly at the output of the Faraday element 3, so that one can dispense with the optical waveguide 6 between the Faraday element 3 and the transducer unit.

In the transducer unit 7, the light coupled out of the Faraday element 3 is divided into two linearly polarized light signals LS1 and LS2 having different polarization planes that are preferably directed at right angles to one another. For this purpose, a Wollaston prism is preferably provided as a beam-splitting analyzer 8. However, it is also possible to provide two polarization filters that are crossed at a suitable angle, preferably 90°, and one beam splitter as an analyzer 8. The two light signals LS1 and LS2 are then converted in associated optoelectric converters 12 and 22, respectively, into electrical signals S1 and S2, respectively, which are a measure of the light intensities of each of light signals LS1 or LS2. Optoelectric converters 12 and 22 may be LEDs (light emitting diodes) preferably connected into amplifier circuits. These two electrical signals S1 and S2 are applied to two outputs of the transducer unit 7.

In the embodiment illustrated, the signal S1 is fed to the filter and division unit 13, and the signal S2 to the filter and division unit 23. In the filter and division unit 13 or 23 assigned to it, the two signals S1 and S2 are respectively split into their direct-signal components (d.c. signals) D1 and D2 and into their alternating-signal components (a.c. signals) A1 and A2, and an intensity-normalized signal P1 or P2 is generated for each signal S1 and S2 as a quotient P1=A1/D1 or P2=A2/D2 from its alternating-signal component A1 or A2 and its direct-signal component D1 or D2. The intensity normalization of the signals S1 and S2 makes it possible to compensate for intensity fluctuations in the transmission paths provided for the corresponding light signals LS1 and LS2 and for sensitivity differences in these two transmission paths. This is especially advantageous when these transmission paths are relatively long, for example, when the analyzer 8 is arranged in the proximity of the Faraday element 3. The light signals LS1 and LS2 are also transmitted, especially in the illustrated embodiment, via optical waveguides acting as transmission paths, which interconnect the beam-splitting analyzer 8 and the optoelectric converters 12 or 22.

One of the intensity-normalized signals, e.g., P1, is provided as a not yet temperature-compensated measuring signal. Using the two normalized signals P1 and P2, a functional value f(P1, P2) is now formed in the computing unit 30. This can equal the difference P1–P2 (or P2–P1) of the two signals P1 and P2 or equal the quotient P1/P2 (or P2/P1) of the two signals P1 and P2. Both the difference P1–P2, as well as the quotient P1/P2 of the two normalized signals P1 and P2 contain clear information about the temperature T of the optical system. The measuring signal P1 and the functional value f(P1, P2) are now fed to the evaluator unit 40. In this evaluator unit 40, a temperature indication T is determined from the functional value f(P1, P2). This value can preferably be tapped off at an output of the evaluator unit 40 assigned to it. With this temperature indication T, from the normalized signal P1, a measuring signal SA corrected in its operating point is determined for the alternating current $I_A$. This measuring signal, which is now substantially independent of temperature, is provided as an output of the evaluator unit 40.

A preset table of values is preferably stored in the evaluator unit 40 and is used to assign the appropriate temperature indication T to the functional value f. This temperature indication T is then used to correct the operating point of the measuring signal SA.

The temperature indication T can, however, also be determined by an adaptation of the values in a comparison operation, i.e., by fitting the function f(P1, P2) to a calibration curve. Suitable calibration curves include, in particular, linear or quadratic functions of P1 and P2 or also a quotient (aP1−bP2)/(cP1−dP2) obtained from two linear functions of P1 and P2 with real coefficients a, b, c and d to be adapted.

In another embodiment of the method of the present invention, the functional value f=f(S1, S2)=S1−S2 is formed as a difference from the two unnormalized signals S1 and S2. The first signal S1 is again drawn upon as a measuring signal and normalized. This normalization can again take place by forming the quotient from its alternating-signal component and its direct-signal component. The normalized signal P1 can, however, also be derived from the quotient S1/(S1+S2) or from the quotient (S1−S2)/(S1+S2) of the two signals S1 and S2. The temperature-corrected measuring signal SA is then derived from the normalized signal P1 and the functional value f. This embodiment of the method of the present invention is especially advantageous in conjunction with a device in which the transmission paths, in particular, the optical waveguides for the light signals LS1 and LS2, are short and in which, therefore, not much damping occurs.

The temperature-corrected measuring signal SA is a direct measure of the measuring angle α that is dependent upon the alternating current $I_A$. To determine the measuring signal SA, either the unnormalized signal S1 or the normalized signal P1, on the one hand, and the functional value f, on the other hand, are drawn upon as a measure of the temperature T. The measuring signal SA is derived from the signal S1 or P1 by means of correction using the functional value f itself or from the temperature indication T determined from this, preferably on the basis of a theoretically approximated or experimentally determined calibration curve or table of values.

I claim:

1. A method for measuring an alternating electrical current in a current conductor comprising:
   a) associating a Faraday element with the current conductor;
   b) coupling linearly polarized light into said Faraday element, whereby, as said light passes through said Faraday element, the plane of polarization of said linearly polarized light will be rotated through a measuring angle on the basis of the Faraday effect, said measuring angle being a measure of the alternating electrical current in said current conductor;
   c) coupling said light, with said polarization plane rotated through said measuring angle, out of said Faraday element and dividing it into first and second light signals having different planes of polarization;
   d) converting said first and second light signals into first and second electrical signals each a measure of the intensity of its corresponding light signal;
   e) forming a functional value which is an unequivocal measure of the temperature from said first and second electrical signals; and
   f) determining a substantially temperature-independent measuring signal for said alternating current using said functional value and said first electrical signal.

2. The method according to claim 1, and further comprising converting at least said first electrical signal into a first intensity-normalized signal, and using said intensity-normalized signal to determine said measuring signal.

3. The method according to claim 2, comprising splitting each electrical signal to be normalized into its corresponding direct-signal component and its corresponding alternating-signal component to normalize intensity, and determining, as said intensity-normalized signal for each electrical signal to be normalized, the quotient formed by dividing its alternating-signal component by its direct-signal component.

4. The method according to claim 2, comprising deriving said first intensity-normalized signal from said first electrical signal by forming the quotient of said first electrical signal divided by the sum of said first and second electrical signals.

5. The method according to claim 2, comprising deriving said first intensity-normalized signal from the quotient of the difference of said first and second electrical signals divided by the sum of said first and second electrical signals.

6. The method according to claim 2, wherein said measuring signal is determined with the help of a calibration curve or table of values determined in advance.

7. The method according to claim 2, and further comprising:
   a) also converting said second electrical signal into an intensity-normalized signal; and
   b) forming said functional value from said first and second intensity-normalized signals.

8. The method according to claim 7, comprising deriving said first intensity-normalized signal from said first electrical signal by forming the quotient of said first electrical signal divided by the sum of said first and second electrical signals.

9. The method according to claim 7, comprising deriving said first intensity-normalized signal from the quotient of the difference of said first and second electrical signals divided by the sum of said first and second electrical signals.

10. The method according to claim 9 comprising providing the difference of either said first and second electrical signals or said first and second intensity-normalized signals as said functional value.

11. The method according to claim 7 comprising providing the difference of either said first and second electrical signals or said first and second intensity-normalized signals as said functional value.

12. The method according to claim 7, wherein the quotient of said first and second normalized signals is provided as said functional value.

13. The method according to claim 12, wherein said measuring signal is determined with the help of a calibration curve or table of values determined in advance.

14. The method according to claim 7, comprising splitting each electrical signal to be normalized into its corresponding direct-signal component and its corresponding alternating-signal component to normalize intensity, and determining, as said intensity-normalized signal for each electrical signal to be normalized, the quotient formed by dividing its alternating-signal component by its direct-signal component.

15. A device for measuring an alternating electrical current in a current conductor, comprising:
   a) a Faraday element associated with said current conductor;
   b) a source of linearly polarized light coupled into said Faraday element, whereby said light, as it passes through said Faraday element, will have its polarization plane rotated in said Faraday element, in dependence upon said alternating current on the basis of the Faraday effect;
   c) a beam-splitting analyzer optically coupled to said Faraday element, splitting the light coupled out of said Faraday element into first and second light signals having different planes of polarization;
   d) an optoelectric converter for each of said first and second light signals to convert said first and second light signals into first and second electrical signals, each of which is a measure of the respective intensity of its corresponding light signal;
   e) a circuit having as inputs said first and second electrical signals and providing as outputs a functional value which is an unequivocal measure of the temperature and a substantially temperature-independent measuring signal for said alternating current, said functional value derived from said first and second electrical signals and said measuring signal derived from said functional value and from said first electrical signal.

16. The device according to claim 15, and further including a polarization-sustaining optical waveguide optically interconnecting said Faraday element and said analyzer.

17. The device according to claim 16, and further including an optical waveguide for each of said two light signals, optically connecting said analyzer and said respective optoelectric converter.

18. The device according to claim 15, and further including an optical waveguide for each of said two light signals, optically connecting said analyzer and said respective optoelectric converter.

19. The device according to claim 18, wherein said circuit includes an evaluator unit having as inputs said functional value and said first electrical signal and providing as outputs said measuring signal and a signal indicating temperature.

20. The device according to claim 15, wherein said circuit includes an evaluator unit having as inputs said functional value and said first electrical signal and providing as outputs said measuring signal and a signal indicating temperature.

* * * * *